United States Patent
Kolwalkar et al.

(10) Patent No.: US 8,626,462 B2
(45) Date of Patent: Jan. 7, 2014

(54) PHASE IDENTIFICATION SYSTEM AND METHOD

(75) Inventors: Amol Rajaram Kolwalkar, Bangalore (IN); John Erik Hershey, Ballston Lake, NY (US); Glen Peter Koste, Niskayuna, NY (US); Michael J Dell'Anno, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 222 days.

(21) Appl. No.: 12/629,144

(22) Filed: Dec. 2, 2009

(65) Prior Publication Data

US 2011/0130992 A1 Jun. 2, 2011

(51) Int. Cl.
*G01R 19/00* (2006.01)
*G01R 25/00* (2006.01)

(52) U.S. Cl.
USPC .............................................. 702/72; 702/66

(58) Field of Classification Search
USPC .................... 702/66, 72; 324/66, 76.52, 76.77
See application file for complete search history.

(56) References Cited

U.S. PATENT DOCUMENTS

| | | | |
|---|---|---|---|
| 4,689,752 A | 8/1987 | Fernandes et al. | |
| 5,510,700 A | 4/1996 | Pomatto | |
| 5,548,207 A | 8/1996 | Smith | |
| 7,372,246 B2 | 5/2008 | Marsden et al. | |
| 2003/0158677 A1 | 8/2003 | Swarztrauber et al. | |
| 2004/0263147 A1 | 12/2004 | Piesinger | |
| 2007/0081600 A1 * | 4/2007 | Sokolov et al. | 375/259 |
| 2008/0077336 A1 | 3/2008 | Fernandes | |
| 2008/0265864 A1 | 10/2008 | Coolidge et al. | |
| 2010/0194378 A1 * | 8/2010 | Kim et al. | 324/76.77 |

FOREIGN PATENT DOCUMENTS

| | | | |
|---|---|---|---|
| GB | 2267971 A | | 12/1993 |
| JP | 61153571 A | | 7/1986 |
| JP | 2000055961 A | | 2/2000 |
| JP | 2001133497 A | | 5/2001 |
| WO | PCT/KR2008/004319 | * | 7/2008 |
| WO | 2009017328 A2 | | 2/2009 |
| WO | 2009057164 A1 | | 5/2009 |

OTHER PUBLICATIONS

EP10193205 Search Report, Mar. 20, 2011.

* cited by examiner

*Primary Examiner* — Sujoy Kundu
(74) *Attorney, Agent, or Firm* — Nitin N. Joshi

(57) ABSTRACT

A phase identification system is proposed. The system includes a sensor coupled to a terminal of a distribution transformer. A processor is coupled to the sensor for processing phase information of the terminal, wherein the sensor and the processor are embedded within a bushing unit on the distribution transformer. The processor is further configured to identify and display phase information at the distribution transformer.

17 Claims, 5 Drawing Sheets

PHASE IDENTIFICATION SYSTEM AND METHOD

BACKGROUND

The subject matter disclosed herein generally relates to phase identification and in particular to phase identification at distribution transformers.

Electric power distribution networks are used by electric utility companies to deliver electricity from generating stations to customers. The distribution voltages vary across utility companies within a country. In a typical power distribution network, three-phase power at a high voltage is delivered to multiple transmission substations. At these transmission substations, high-voltage power is stepped down to an intermediate three-phase voltage. The intermediate-voltage three-phase power from each substation is then delivered to multiple distribution substations. At the distribution substations, the intermediate-voltage is stepped down to a lower distribution voltage and separated into three single-phase feeder lines. Each of these feeder lines branches into multiple circuits to power multiple distribution transformers that step the voltage down to a final single-phase voltage for delivery to the commercial and residential customers.

It is desirable to have the feeder circuits with balanced loads such that the current loads on each single-phase output of a three-phase transformer are equal. However, over time, as customers are added and removed, the loads on each single-phase output may change and become unbalanced. To re-balance the loads, some of the branch circuits are typically moved from a more heavily loaded phase to a more lightly loaded phase. If the phase of each line in the feeder circuit is not accurately known, a line may be erroneously removed from a more lightly loaded phase and placed on a more heavily loaded phase. Such errors result in the procedure having to be repeated, which causes a second disruption in service to all customers on the branch being re-phased. Adding a greater load to the more heavily loaded phase may cause imbalance loading on substation that may result in a power outage for all customers on the overloaded phase.

To identify the phase of a particular feeder branch using conventional manual techniques, utility company personnel must physically trace a line run back through various distribution cabinets until the line reaches a point in the distribution network at which the phase is definitely known. This can be a time consuming, labor-intensive process.

Various devices and methods have been implemented to attempt to identify phase, such as by use of modems and telephone lines to establish a communication link. A signal associated with the phase at a point in the network where the phase of the line is known (the reference line) is transmitted over the communication link to a point in the network where the phase of the line is not known (the line under test). Difficulties arise when delays in the communication link affect the accuracy of the phase measurement.

One method to reduce communication delays implements a communication link via radio transmissions. Another method is to compare phases between electric power system substations in real time via time base synchronization through Global Positioning System (GPS) data from both the reference line and the line under test to eliminate delay and synchronization problems.

In these approaches, a pre-established real-time communication link is required. That is, a communication link needs be established and active at the time the phase of the line under test is measured. This renders these approaches unusable wherever and whenever the communication link cannot be established. Also, because the phase of the line under test is determined for each measurement, the measuring apparatus must be retrieved after each test. This precludes the ability to make several different tests before accessing the apparatus, e.g., measuring the phases of several different overhead lines in a substation before lowering the "hot stick" to which the apparatus is attached.

Accordingly, there is a need to provide an improved apparatus and method for the identification of line phase of a power line in a three-phase power distribution network.

BRIEF DESCRIPTION

Briefly, a phase identification system is proposed. The system includes a sensor coupled to a terminal of a distribution transformer. A processor is coupled to the sensor for processing phase information of the terminal, wherein the sensor and the processor are embedded within a bushing unit on the distribution transformer. The processor is further configured to identify and display phase information at the distribution transformer.

In another embodiment a method to identify phase information at a distribution transformer terminal is presented. The method includes sensing an electrical distribution parameter from a sensor coupled to a terminal of a distribution transformer, obtaining an electrical substation parameter from a substation, and comparing the distribution parameter with the substation parameter. The method further includes identifying phase information of the terminal and displaying the phase information of the terminal at the distribution transformer terminal.

In another embodiment, a system includes a distribution network with a substation coupled to a plurality of distribution transformers. The system further includes a plurality of sensors coupled to terminals of the distribution transformers and the substation, each sensor configured to detect at least one electrical parameter. The system includes a data center for processing and comparing the electrical parameters and a phase identification unit coupled to the data center and embedded within terminals of the distribution transformer. The phase identification unit is configured to identify a phase information at the terminals of the distribution transformers.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
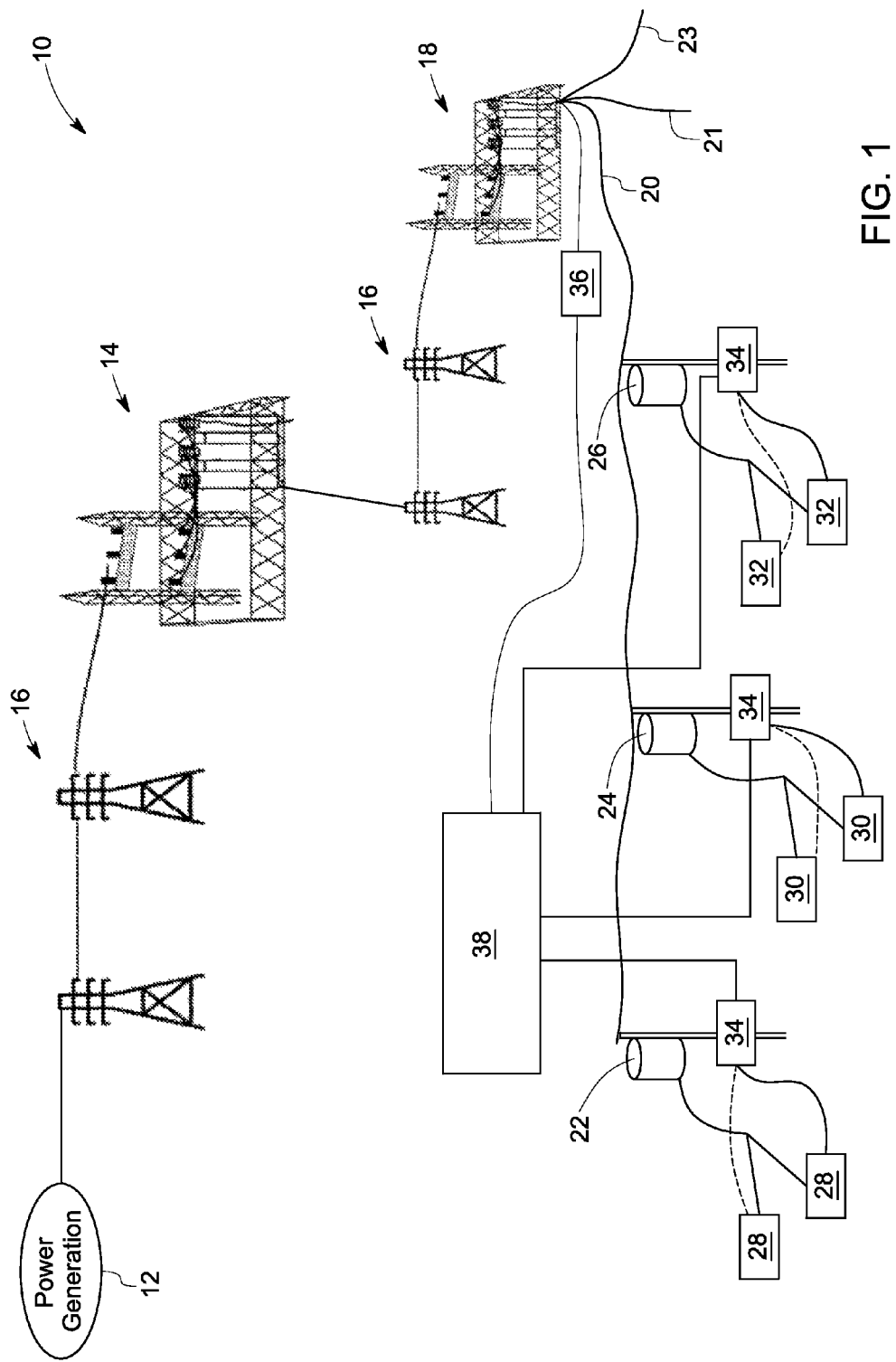
FIG. 1 illustrates an electrical distribution network implementing a phase identification system according to an embodiment of the invention.

FIG. 1 illustrates an electrical distribution network implementing a phase identification system according to an embodiment of the invention. The distribution network 10 includes transmission lines to transfer power generated at a power generation site 12 to one or more utilities. Power generation site 12 may include, for example, one or more hydro, thermal, nuclear, or combined gas cycle power plants. Power from the generation site 12 is transmitted at high voltages via high voltage transmission lines 16. High voltage is stepped down to intermediate voltage at transmission substation 14. Further downstream, the intermediate voltages are further stepped down to medium voltage at distribution substation 18. Feeder lines 20 couple the distribution substation to distribution transformers 22,24,26 that supply power to end users such as industrial or residential consumers 28,30,32. For the sake of simplified illustration, a single power generation site, single distribution substation, and single feeder are illustrated. However, multiple such power generation sites may be coupled to multiple transmission substations and distribution substations with multiple feeder lines to form an electrical distribution network or grid.

Phase identification unit 34 coupled to the distribution transformers are configured to provide electrical parameters indicative of phase information at terminals of the distribution transformers. Further, one or more phase identification units 36 is disposed on substation transformers. In one embodiment a data center 38 is located in a remote location from the local distribution transformers 34 and substation 18 and coupled to the phase identification unit 34, 36. In an exemplary embodiment, data center 38 may implement a correlation technique to compare the electrical parameters from the distribution transformers and the substation transformers. Further, the phase information may be transmitted back to the phase identification unit at the distribution transformers for local annunciation.

Figure 2:
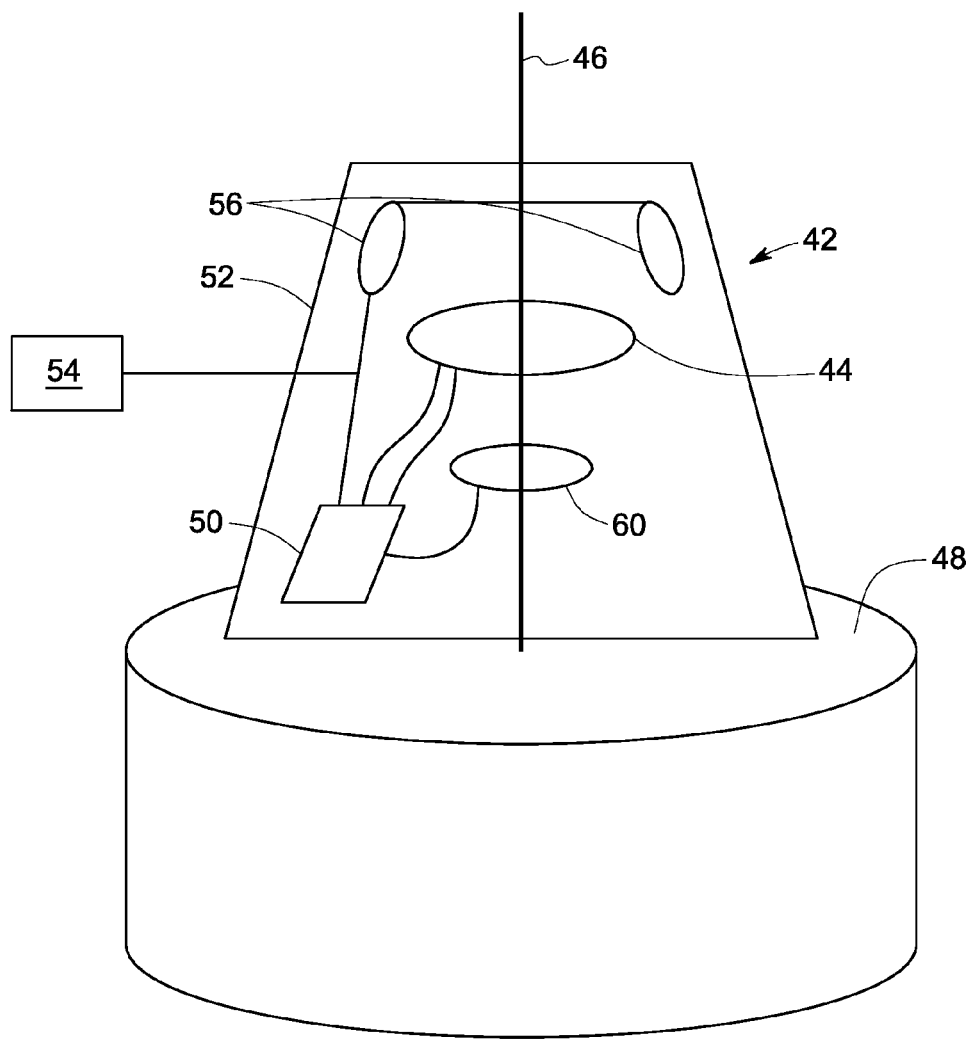
FIG. 2 illustrates a partial view of a terminal in a distribution transformer that uses a phase identification unit according to an embodiment of the invention.

FIG. 2 illustrates a partial view of a terminal of a distribution transformer that uses a phase identification unit 42 according to an embodiment of the invention. In the embodiment of FIG. 2, a sensor 44 is coupled to a terminal 46 of a distribution transformer 48. The terminal 46 may include a high voltage terminal or a low voltage terminal of the transformer that requires phase identification. The sensor 44 may include, for example, a current transformer to detect at least one of a noise pattern, a geometric harmonic modulated signal, or an amplitude of current/voltage harmonics. A processor 50 is coupled to the sensor 44 for computing phase information of the terminal 46. As used herein, "processor" may include any digital/analog circuit or integrated circuit configured to perform data acquisition, computing, comparing, or analyzing system data such as electrical parameters for information storage or for determining command signals for control actions. The sensor 44 and the processor 50 are embedded within a bushing unit 52 of the distribution transformer 48. A display 54 coupled to the processor 50 and disposed outside the bushing unit 52 is configured for displaying the phase information. The display may include an annunciation system such as a LED display or color-coded lights indicating the phase information. In one embodiment, the phase identification unit 42 alternatively or additionally includes an antenna 56 coupled to the processor for wireless transmission of electrical parameters to a data center. Power to operate the sensor 44 and the processor 50 and other components may be harvested from the voltage present in the transformer. Optionally, system 42 may include a power harvester comprising an inductive pick up coil 60 magnetically coupled to the terminal 46 for supplying power to the sensor 44, the processor 50, and the optional display 54. Alternatively, power harvester may include a capacitive coupling or a step-down transformer (not shown) that is appropriately connected with the terminal 46 and a ground. In operation, the phase identification unit 42 may implement at least one of the three techniques discussed with respect to FIGS. 3-5. It may be noted that the phase identification unit having the sensor, the processor, and the display may be configured to retrofit into a bushing unit of a presently operational distribution transformer.

Figure 3:
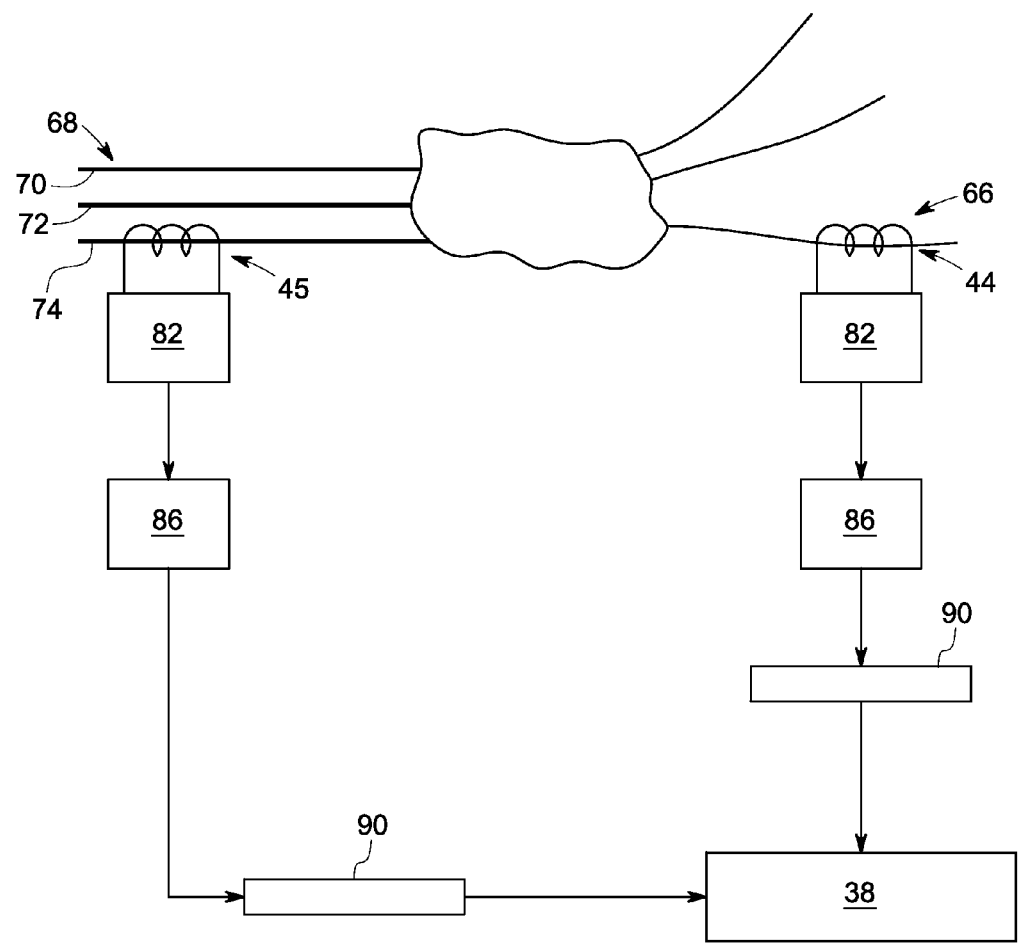
FIG. 3 illustrates a block diagram of a phase identification system implementing noise correlation according to an embodiment of the invention.

FIG. 3 illustrates a block diagram of a phase identification system implementing noise correlation according to an embodiment of the invention. In this embodiment, the sensor 44 is configured to sense an electrical parameter comprising a noise pattern at a utility node 66 (where the phase information has to be determined) and is compared with a noise pattern at a substation 68, or any other location where the phase is known. In one embodiment, utility node 66 may comprise a terminal 46 of a distribution transformer 48 such as shown in FIG. 2, for example. The correlation technique relies upon finding the maximum cross-correlation of noise samples taken at one site (for example at utility node 66) on one phase with noise samples taken upstream (such as at substation 68) on three phases 70, 72, 74. As cross-correlation is most effective if the sampling occurs at the same time at both sites (66,68), it is useful to have communications and sampling protocol that ensures synchronization. In one embodiment, to obtain synchronized samples, electrical parameters at the substation are continuously sampled and stored (in the data center) with time stamps and samples from the distribution transformer are also stored with time stamps.

In an exemplary method, to compute phase information at utility node 66 of the phase of the voltage on power line 80, noise samples are simultaneously gathered, for example via sensor 44 coupled to power line 80 and sensor 45 coupled to power line 74. In one embodiment, for example, sensors 44 and 45 comprise induction couplers. A bandpass filter 82 having a central frequency between two sequential harmonics, such as 120 Hz and 180 Hz, for example, may be configured to filter the noise between the two sequential harmonics. The filtered noise is then sampled and, an analog-to-digital converter 86 is used to produce digital packets 90 representative of the noise voltage at the sample time. These packets are communicated to data center 38 where a cross-correlation is performed between the noise samples from substation 68 and the noise samples at the utility node 66. In one embodiment, the process of gathering samples from the substation is executed on all three phases of the substation (lines 70, 72, 74) and on all three lines at the utility node, and the closest correlation is used to determine the phase of the voltage on power line 80.

Referring back to FIG. 2, the phase identification unit 42 may include the filter 82 and the analog-to-digital converter 86 (of FIG. 3) within the processor 50. Further, correlated phase information from the data center 38 (FIG. 3) may be communicated back to the processor 50 for displaying the phase information on the display 54. Communication between the processor 50 and the data center 38 may include wired transmission or wireless transmission via antenna 56.

Figure 4:
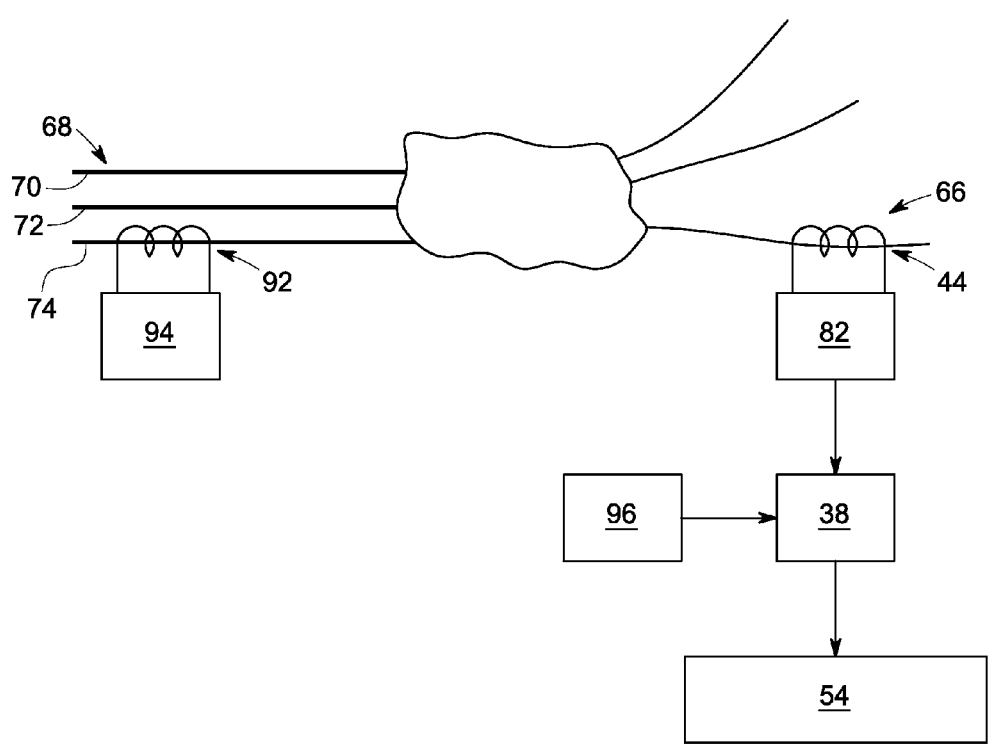
FIG. 4 illustrates a block diagram of a phase identification system implementing a geometric harmonic modulation signal according to an embodiment of the invention.

FIG. 4 illustrates a block diagram of a phase identification system implementing a geometric harmonic modulation signal according to an embodiment of the invention. In this embodiment, one or more GHM signals are injected at one or more points in the distribution network where the phase is known and demodulated where the phase information has to be determined. In one example a signal is injected at substation 68 and demodulated at utility node 66.

GHM signals are generated by GHM signal generators 94, only one of which is shown for purposes of example, and added to the distribution network, by inductive coupling via a couplers 92, for example, to the three phase lines 70, 72, 74 at the substation 68. The components of the GHM signals are configured to have frequencies that are as low as possible in order to traverse capacitor banks and other low pass filters that are found in distribution networks. In one example, these frequencies are in the range of a few hundreds of Hz. At the measurement site such as utility node 66, the three GHM signals are extracted, via inductive coupling, for example, using sensors 44. Filters 82, only one of which is shown for purposes of example, having narrow bandpass segments about the tones of the candidate GHM signals are configured to filter the GHM signals. In one example, the filters may include active filters and perform analog subtraction. The filtered GHM signals are cross-correlated in the data center 38 against the three possible transmitted signals, and the largest cross-correlation peak is used to identify which of the three candidate GHM signals is on the phase of the voltage on power line 80.

In another exemplary embodiment, the phase identification unit 42 of FIG. 2 implements a method to correlate the electrical parameters, wherein the electrical parameters comprise at least one of a voltage waveform, a current waveform, a noise pattern, and a harmonic amplitude. Characteristics of voltage or current waveforms include, for example, peak amplitude, phase difference, and frequency domain attributes such as harmonic peak amplitude. In one embodiment, an alternative to performing a correlation of the entire voltage or current waveform is to use a narrower frequency band of noise between the harmonic frequency content for correlation. There may exist pronounced frequency dependence of the harmonics or the background noise visible in the spectral regions between the harmonics. Similar electrical noise characteristics that exist at lower frequencies may travel to the individual distribution transformers connected to the respective phase. The faithfulness with which the noise on one phase at the substation will be present at the distribution transformer will be dependent on the noise or interfering signals on the power line and also on the attenuation suffered in traversing the portion of the distribution network.

Figure 5:
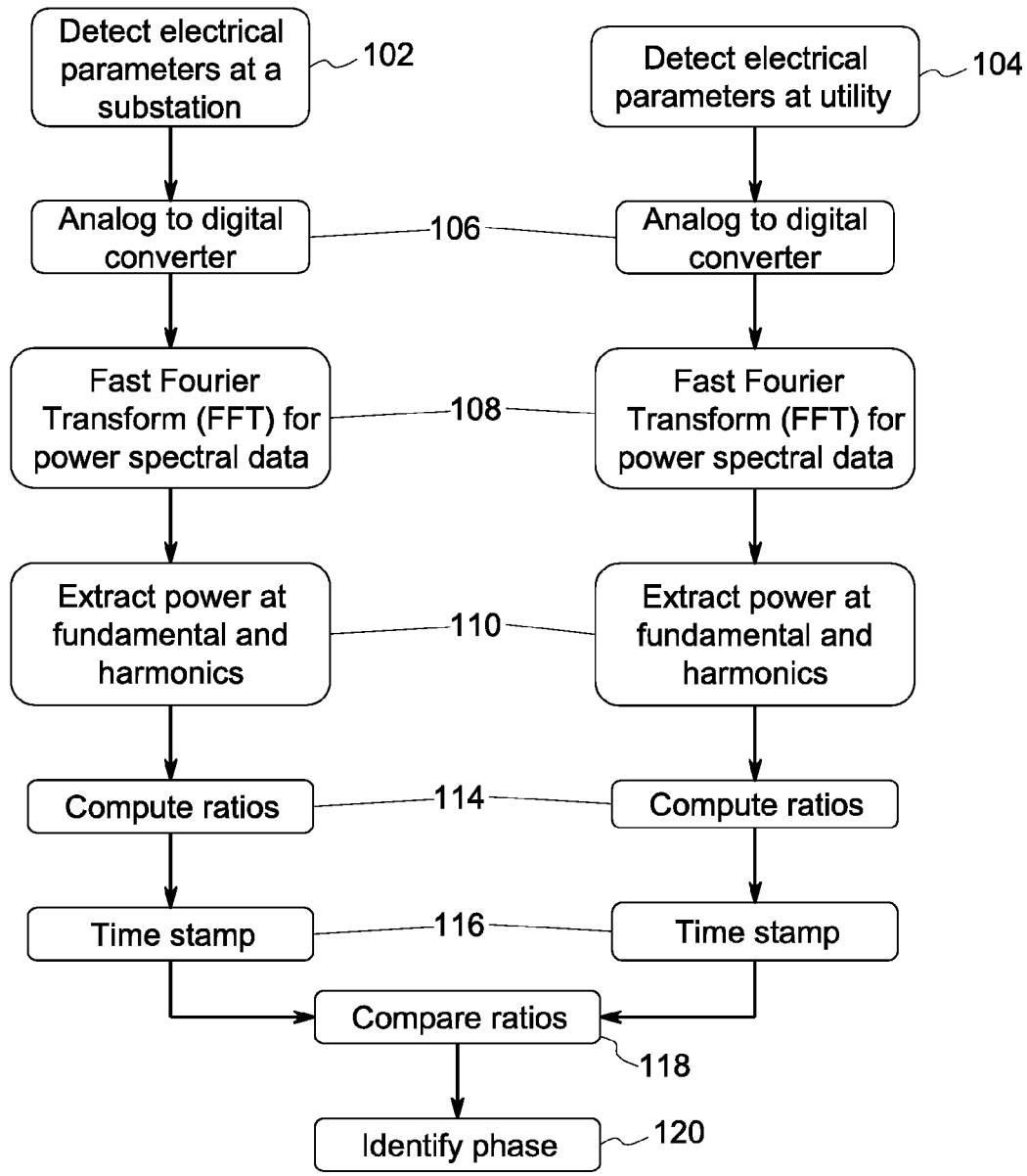
FIG. 5 illustrates an exemplary method for phase identification according to an embodiment of the invention.

FIG. 5 illustrates an exemplary method for phase identification according to an embodiment of the invention. The method 100 includes determining the electrical parameters at a substation, or any other location where the phase is known at step 102. The method also includes determining the electrical parameters at a utility node in step 104, where the phase information has to be determined The subsequent steps include converting the electrical parameters from analog to digital signals at 106. The electrical parameters may include but not limited to voltage/current harmonics or noise pattern. The digital signals from step 106 are converted to frequency domain via fast Fourier transform (FFT) in step 108. Power at fundamental frequency and at multiple harmonics, for example, third, fifth, and seventh is extracted (in step 110) from the frequency spectrum obtained from the FFT. Various ratios such as ratio of the amplitude of power between first and third, or third and fifth, or combinations thereof are computed at step 114. A time stamp is applied on the computed ratios in step 116. In step 118, the ratios from the substation are compared with the ratios from utility node. When a strong correlation is found between the substation ratios and the utility ratios, the phase at the utility node is determined in step 120.

Advantageously, such online monitoring of phase information at distribution transformers provides valuable information that is critical for network operations. Phase identification helps distribute load across the grid to improve stability. Further, identifying correct phase of the loads and that of the distribution transformer enables differentiation between single phase and three phase faults and in turn enable outage management systems that rely on the phase information. Added benefits include the ability to accurately model the system and predict the loads on the feeder to ensure that reliable network models are available for analysis. The phase identification system as disclosed herein includes local annunciation that would indicate the phase to which the distribution transformer is connected. Such online systems would eliminate the laborious process of tracking the phase manually from the distribution transformers to the substation. Furthermore, such systems do not suffer from communication delay and synchronization difficulties, and do not require calibration procedures.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A phase identification system comprising:
   a sensor coupled to a terminal of a distribution transformer and configured to sense electrical parameters;
   a processor coupled to the sensor for processing the electrical parameters at the terminal, wherein the sensor and the processor are embedded within a bushing unit on the distribution transformer;
   wherein the processor is further configured to identify and display phase information at the distribution transformer by analyzing a noise pattern extracted by a filter from the electrical parameters.

2. The phase identification system of claim 1 further comprising an antenna coupled to the processor for transmitting the phase information to a data center.

3. The phase identification system of claim 1, wherein the processor is further configured to compare a second noise pattern from a sub-station transformer or a location where phase is known with the noise pattern of the distribution transformer.

4. The phase identification system of claim 1, wherein the sensor is configured to detect a geometric harmonic modulated signal.

5. The phase identification system of claim 1, wherein the processor is configured to detect a harmonic amplitude from a plurality of harmonics detected by the sensor.

6. The phase identification system of claim 1, wherein the processor is further coupled to a data center for processing and comparing the electrical parameters.

7. The phase identification system of claim 1 further comprising a power harvester for supplying power to the sensor, the processor, and the display.

8. A method to identify phase information at a distribution transformer terminal comprising:
   filtering a noise pattern of an electrical distribution parameter in a sensor coupled to a terminal of a distribution transformer,
   identifying phase information of the terminal by analyzing the filtered noise pattern; and
   displaying the phase information of the terminal at the distribution transformer terminal.

9. The method of claim 8, wherein the electrical distribution parameter comprises at least one of a voltage waveform or a current waveform.

10. The method of claim 8 further comprising communicating the phase information to a data center.

11. The method of claim 8 further comprising injecting a geometric harmonic modulated signal into a substation or the terminal.

12. The method of claim 11 further comprising demodulating the geometric harmonic modulated signal.

13. The method of claim 11 further comprising detecting voltage amplitudes of a plurality of voltage harmonics of the electrical distribution parameter and an electrical substation parameter of the substation and comparing the detected voltage amplitudes.

14. A system comprising:
   a distribution network comprising a substation coupled to a plurality of distribution transformers;
   a plurality of sensors coupled to terminals of the distribution transformers, each sensor configured to detect at least one electrical parameter;
   a data center for processing the electrical parameters; and
   a phase identification unit coupled to the data center and embedded within a terminal of the distribution transformer, the phase identification unit configured to identify a phase information at the terminals of the distribution transformers by analyzing a noise pattern extracted by a filter from the at least one electrical parameter.

15. The system of claim 14, wherein the sensors are configured to detect a voltage waveform or a current waveform.

16. The system of claim 14, wherein the phase identification system comprises a digitizer configured to digitize the electrical parameters.

17. The system of claim 14, wherein the phase identification system comprises a processor to compute relative harmonic amplitudes.

* * * * *